United States Patent
Hsu

(10) Patent No.: US 9,772,358 B2
(45) Date of Patent: Sep. 26, 2017

(54) ELECTRICAL ENERGY TRANSFERRING DEVICE SHOWING POWER CONSUMPTION/CHARGING STATUS

(71) Applicant: Prolific Technology Inc., Taipei (TW)

(72) Inventor: Chia-Chang Hsu, Zhubei (TW)

(73) Assignee: PROLIFIC TECHNOLOGY INC., Taipei (TW)

(*) Notice: Subject to any disclaimer, the term of this patent is extended or adjusted under 35 U.S.C. 154(b) by 40 days.

(21) Appl. No.: 14/589,499

(22) Filed: Jan. 5, 2015

(65) Prior Publication Data
US 2015/0194042 A1    Jul. 9, 2015

(30) Foreign Application Priority Data
Jan. 6, 2014 (TW) ............... 103100322 A

(51) Int. Cl.
*G08B 21/00* (2006.01)
*G01R 22/10* (2006.01)

(52) U.S. Cl.
CPC .................. *G01R 22/10* (2013.01)

(58) Field of Classification Search
CPC .............. G01R 22/10; H01R 25/003
USPC ........................................... 340/654
See application file for complete search history.

(56) References Cited

U.S. PATENT DOCUMENTS

| | | | | |
|---|---|---|---|---|
| 2006/0258226 A1* | 11/2006 | Milan | .................. | H01R 13/506 439/652 |
| 2009/0079416 A1* | 3/2009 | Vinden | .................. | G01R 22/06 324/103 R |
| 2011/0254371 A1* | 10/2011 | Galsim | .................. | G06F 1/263 307/39 |
| 2012/0086437 A1* | 4/2012 | Lin | .................. | G01R 22/10 324/156 |
| 2012/0256755 A1* | 10/2012 | Tsujimura | .................. | G01D 4/002 340/657 |
| 2013/0021162 A1* | 1/2013 | DeBoer | .................. | B60L 11/1824 340/635 |
| 2013/0338844 A1* | 12/2013 | Chan | .................. | H01R 13/6683 700/295 |

FOREIGN PATENT DOCUMENTS

| | | |
|---|---|---|
| CN | 101447621 A | 6/2009 |
| CN | 102356363 A | 2/2012 |
| CN | 102667504 A | 9/2012 |

(Continued)

OTHER PUBLICATIONS

Taiwanese Office Action dated Nov. 14, 2014.

(Continued)

*Primary Examiner* — Mark Rushing
(74) *Attorney, Agent, or Firm* — Rabin & Berdo, P.C.

(57) ABSTRACT

An electrical energy transferring device coupled to an electrical energy receiving device is provided. The electrical energy transferring device includes an electrical source measuring unit and a power indicating unit. The electrical source measuring unit detects a power consumption and/or a charging status of the electrical energy receiving device. The power indicating unit is coupled to the electrical source measuring unit for showing the power consumption and/or the charging status of the electrical energy receiving device by a color signal and/or an audio signal.

7 Claims, 6 Drawing Sheets

(56) References Cited

FOREIGN PATENT DOCUMENTS

| | | |
|---|---|---|
| CN | 102891510 A | 1/2013 |
| CN | 203339424 U | 12/2013 |
| TW | 201128861 A | 8/2011 |
| TW | 201215897 A1 | 4/2012 |
| TW | M450895 U1 | 4/2013 |
| TW | M463454 U | 10/2013 |
| TW | M468049 U | 12/2013 |

OTHER PUBLICATIONS

Chinese Office Action dated Jul. 6, 2016.
Taiwanese Office Action dated Jul. 15, 2016.
Taiwanese Office Action dated Mar. 20, 2017.
Chinese Office Action dated Mar. 13, 2017.

* cited by examiner

ELECTRICAL ENERGY TRANSFERRING DEVICE SHOWING POWER CONSUMPTION/CHARGING STATUS

This application claims the benefit of Taiwan application Serial No. 103100322, filed Jan. 6, 2014, the subject matter of which is incorporated herein by reference.

TECHNICAL FIELD

The disclosure relates in general to an electrical energy transferring device showing power consumption/charging status.

BACKGROUND

Electricity is indispensable to modern people in their everyday life. Normally, if people find the number of sockets at home is not enough, they may choose to plug an extension cord to a socket, such that they may plug several appliances to the sockets of the extension cord.

Normally, the upper power limit of an extension cord (for example, the upper limit of total current being 12 or 15 ampere (A)) is indicated on the extension cord. However, those who do not have a good knowledge of electricity still cannot easily understand current power consumption status of the extension cord despite having seen the indication of the upper limit of total current. Under such circumstance that the user is not aware of power consumption and overuses the extension cord, the power may be interrupted and electrical fire may be resulted.

Preferably, a socket, an extension cord or a charger capable of showing current power consumption or current charging status is provided to help those not having basic knowledge of electricity be aware of current power consumption or charging status.

SUMMARY OF THE DISCLOSURE

The disclosure is directed to an electrical energy transferring device for showing/reminding a power consumption and/or a charging status by a color signal and/or an audio signal.

According to one embodiment of the present disclosure, an electrical energy transferring device coupled to an electrical energy receiving device is provided. The electrical energy transferring device includes an electrical source measuring unit and a power indicating unit. The electrical source measuring unit detects a power consumption and/or a charging status of the electrical energy receiving device. The power indicating unit is coupled to the electrical source measuring unit for showing the power consumption and/or the charging status of the electrical energy receiving device by a color signal and/or an audio signal.

The above and other contents of the disclosure will become better understood with regard to the following detailed description of the preferred but non-limiting embodiment (s). The following description is made with reference to the accompanying drawings.

DETAILED DESCRIPTION OF THE DISCLOSURE

Technical terms of the disclosure are based on general definition in the technical field of the disclosure. If the disclosure describes or explains one or some terms, definition of the terms is based on the description or explanation of the disclosure. For any technologies and theories which are commonly seen in the technology field of the present disclosure but not involved with the technical features of the present disclosure, the details will be omitted. Further, shapes, sizes and ratios of the objects are exemplary for one skilled person in the art to understand the disclosure, not to limit the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure.

A power socket extension device showing power consumption is disclosed in an embodiment of the disclosure. The power socket extension device measures the power consumption of a socket, an extension cord, a charger or a charging transmission line and further show the status of power consumption by way of color, flash or sound (beep) to indicate power consumption region. The power socket extension device of the present embodiment further provides overloading warning and protection functions.

In the embodiments of the disclosure, the extension cord, the charger, and the transmission line (for example, the USB transmission line) are collectively referred as electrical energy transferring devices. The extension cord transfers the electrical energy received from an electrical source (for example, a wall socket or another extension cord) to an electrical energy receiving device (for example, a home appliance (such as a microwave oven or a washing machine), or a computer). The charger is plugged into a socket for supplying electrical energy to an electrical energy receiving device. For example, the user may plug a charger into a socket for charging a mobile device such as a mobile phone or a tablet computer. The transmission line is integrated with the charger for charging a mobile device such as a mobile phone or a tablet computer. Or, the transmission line may be plugged into a USB slot of a computer for charging a mobile device such as a mobile phone or a tablet computer. In following descriptions of the disclosure, the units/devices which supplies electrical energy to the electrical energy receiving device are collectively referred as an electrical energy supplying unit (for example, a wall socket or a computer).

Scientific findings show that humans' biological instincts have good perception/response/alert to audio signals and color signals. In the embodiments of the disclosure, the showing of power consumption and/or charging status of an electrical energy transferring device is designed based on the said scientific findings.

Figure 1:
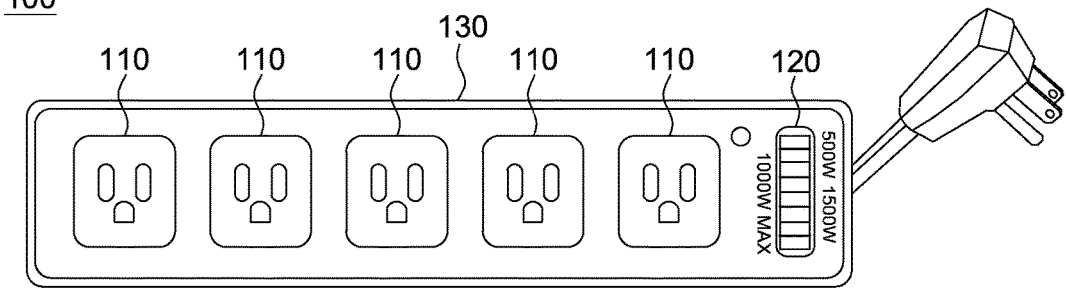
FIG. 1 is a schematic diagram of an electrical energy transferring device according to an embodiment of the disclosure.

Referring to FIG. 1, a schematic diagram of an electrical energy transferring device 100 according to an embodiment of the disclosure is shown. In the present embodiment, the electrical energy transferring device 100 is exemplified by a power extension cord. The electrical energy transferring device 100 includes several sockets 110, an upper power limit selection unit 120 and a power indicating unit 130.

The socket 110 provides electrical energy to an electrical energy receiving device (not illustrated) after the power cable of the electrical energy receiving device is plugged into the socket 110.

The upper power limit selection unit 120 sets an upper power limit of the electrical energy transferring device 100 in response to the user's operation/selection. In an embodiment of the disclosure, exemplarily but not restrictively, the upper power limit selection unit 120 may set the upper power limit of the electrical energy transferring device 100 as, for example, 500 watts (W), 1000 W, 1500 W, or no upper limit in response to the user's operation/selection. If the current power consumption of the electrical energy transferring device 100 is over the power upper limit, the power indicating unit 130 may warn and/or the internal protection unit of the electrical energy transferring device 100 may break off the power path between the electrical energy transferring device 100 and the electrical energy supplying unit, to avoid the electrical energy transferring device 100 being overloaded, overheated and burnt down.

The power indicating unit 130 indicates the current power consumption of the electrical energy transferring device 100 by using a color signal. Besides, the power indicating unit 130 may further include a buzzer. When the electrical energy transferring device 100 is nearly overloaded or already overloaded, the power indicating unit 130 indicates the current situation to remind the user by using an audio signal. As indicated in FIG. 1, the power indicating unit 130 surrounds the electrical energy transferring device 100, but the disclosure is not limited thereto. In other possible embodiments, various modifications may be made to the shape and position of the power indicating unit 130, and such modifications are still within the spirit of the disclosure.

In the embodiments of the disclosure, the design of setting/showing/informing the current power consumption is based on humans' biological instinct of perception. If the current power consumption is low, a cool color such as blue or green is used to inform the user of the current situation of low power consumption. If the current power consumption is medium, a warm color such as yellow or orange is used to inform the user of the current situation of medium power consumption. If the current power consumption is high, a warning color such as red or purple is used to warn the user that a critical range is nearly reached. If the current power consumption is overloading, flash or sound is used to inform the user that currently the power is already overloaded. Therefore, the user does not need to have a basic knowledge of electricity but still may easily identify power status without watching the LCD screen at a short distance and accordingly adjust the power status to avoid the device overloading and electrical fire.

In an embodiment of the disclosure, the power indicating unit 130 may include a full-color LED (that is, full-color display element) for showing the current power consumption of the electrical energy transferring device 100 by using a full-color blend display. For example, if the current power consumption is 0%, a blue color is shown. If the current power consumption gradually changes to 0%~90%, a color blend display, such as blue→green→yellow→red→purple, is shown. If the current power consumption is between 90%~100%, a purple color is shown and a full-color LED flashes. If the current power consumption is over 100%, a purple color is shown, an LED flashes and a buzzer beeps to warn the user.

Or, the power indicating unit 130 may include several single-color LEDs (that is, several single-color display elements) for showing the current power consumption by using single-color display regions. For example, if the current power consumption is 0%, blue color is shown (that is, a blue LED is turned on). If the current power consumption is between 0%~60%, green color is shown. If the current power consumption is between 60%~80%, yellow color is shown. If the current power consumption is between 80%~90%, red color is shown. If the current power consumption is between 90%~100%, red color is shown and a red LED flashes. If the current power consumption is over 100%, red color is shown, a red LED flashes, and a buzzer (that is, an audio warning device) beeps to warn the user. Besides, each region may have a hysteresis region about 1%~5%, which is used as a display buffer area, to assure that switching between the color regions is smooth and correct. Suppose the current power consumption is 58%. If the power consumption continuously increases, green color is shown. If the power consumption continuously decreases, yellow color is shown.

In FIG. 1, the current power consumption refers to the sum of power consumptions of all sockets 110.

Figure 2:
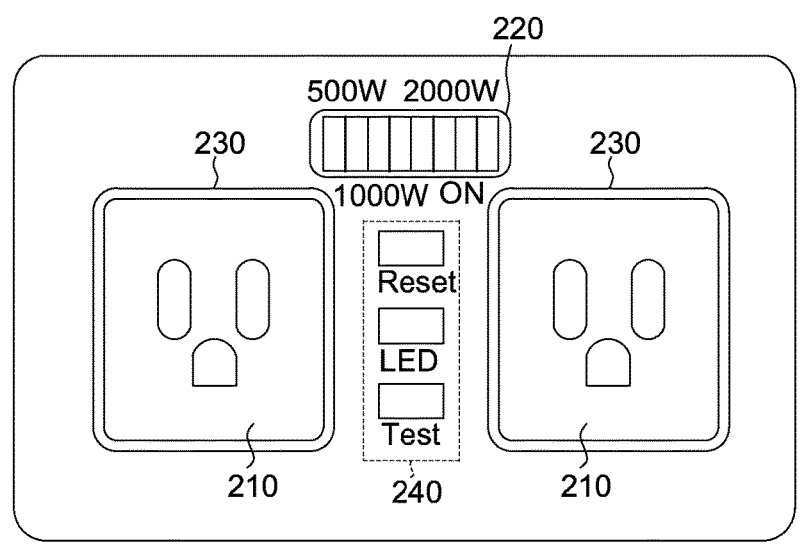
FIG. 2 is a schematic diagram of an electrical energy transferring device according to another embodiment of the disclosure.

Referring to FIG. 2, a schematic diagram of an electrical energy transferring device 200 according to another embodiment of the disclosure is shown. In the present embodiment, the electrical energy transferring device 200 is exemplified by a power extension cord. The electrical energy transferring device 200 includes several sockets 210, an upper power limit selection unit 220, several power indicating units 230 and several press-keys 240.

Relevant details of the electrical energy transferring device 200 of FIG. 2 are identical or similar to that of the electrical energy transferring device 200 of FIG. 1 except that the current power consumption of FIG. 2 refers to the power consumption of an individual socket 210. That is, the respective power indicating unit 230 indicates the current power consumption of the respective socket. Likewise, the respective power indicating unit 230 may show the current power consumption of the respective socket 210 by using a full-color blend display or single-color display regions.

In FIG. 2, the power indicating unit 230 surrounds the socket 210, but the disclosure is not limited thereto. In other possible embodiments, various modifications may be made to the shape and position of the power indicating unit 230, and such modifications are still within the spirit of the disclosure.

Exemplarily but not restrictively, the press-keys 240 of FIG. 2 include an operation status press-key, a reset press-key and a testing press-key. The operation status press-key controls the ON/OFF status of the electrical energy transferring device 200. In response to the reset press-key is triggered, the electrical energy transferring device 200 may be reset. In response to the testing press-key is triggered, the leakage current function of the electrical energy transferring device 200 is tested.

Figure 3:
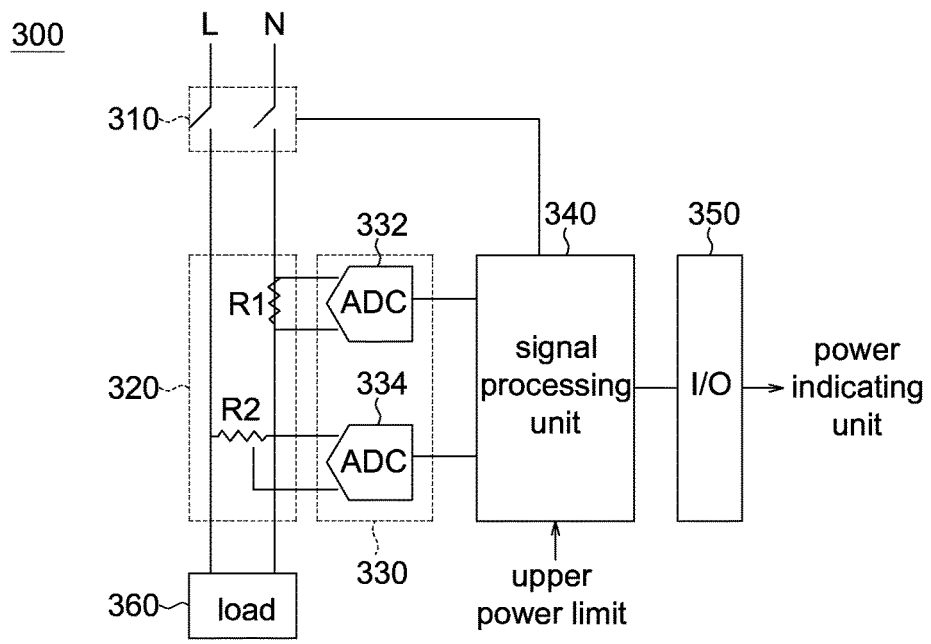
FIG. 3 is a circuit diagram of an electrical energy transferring device according to an alternate embodiment of the disclosure.

Details of detecting the current power consumption of the electrical energy transferring device according to an embodiment of the disclosure are disclosed below. Referring to FIG. 3, a circuit diagram of an electrical energy transferring device 300 according to an alternate embodiment of the disclosure is shown. The circuit configuration of FIG. 3 may be used in the electrical energy transferring device 100 of FIG. 1 and/or the electrical energy transferring device 200 of FIG. 2.

The electrical energy transferring device 300 includes a power input sources L and N (L represents live wire; N represents neuter wire), a protection unit 310 (having one or more than one switch relay or mechanical trip switch), a sensing unit 320, a conversion unit 330, a signal processing unit 340, an I/O interface 350 and a load 360. The load 360, for example, is one or more than one socket 110/210. In addition, the electrical energy transferring device 300 further includes a voltage conversion unit (for example, an AC/DC voltage conversion unit) for converting an AC voltage into a DC voltage to supply the DC voltage to the protection unit 310, the sensing unit 320, the conversion unit 330, the signal processing unit 340 and the I/O interface 350.

The power input sources L and N receive an AC input voltage. The protection unit 310 is coupled to the power input sources L and N and the signal processing unit 340. The protection unit 310 is controlled by the signal processing unit 340 (exemplarily but not restrictively, a digital signal processing unit (DSP)). When the signal processing unit 340 decides that the power consumption of the electrical energy transferring device 300 is over the safety limit, the signal processing unit 340 controls the protection unit 310 to be turned off to keep the AC input voltage from being inputted to the electrical energy transferring device 300, and the electrical energy transferring device 300 will not be overheated and burnt down.

The sensing unit 320 senses the current and/or voltage and/or temperature and/or leakage voltage of the electrical energy transferring device 300. In FIG. 3, the sensing unit 320 includes resistors R1 and R2 (i.e. the resistors are serially connected). The resistors R1 and R2 respectively are coupled to analog digital converters (ADC) 332 and 334 of the conversion unit 330.

The analog digital converter 332 detects and converts a current flowing through the resistor R1 into a digital current signal, and further outputs the digital current signal to the signal processing unit 340. Likewise, the analog digital converter 334 detects and converts a voltage of the resistor R2 into a digital voltage signal, and further outputs the digital voltage signal to the signal processing unit 340.

The signal processing unit 340 calculates the current power consumption of the electrical energy transferring device 300 according to the digital current and voltage signals received from the conversion unit 330. The signal processing unit 340 compares the current power consumption of the electrical energy transferring device 300 with the upper power limit signal (received from the upper power limit selection unit 120/220) to determine how to control the power indicating unit and how to control the protection unit 310.

The I/O interface 350 is coupled to the signal processing unit 340 and the power indicating unit for driving the power indicating unit according to the signal processing result of the signal processing unit 340.

The circuit configuration of FIG. 3 may be used in the electrical energy transferring device 100 of FIG. 1 and/or the electrical energy transferring device 200 of FIG. 2 which shows the power consumption information by using a full-color blend display.

Figure 4:
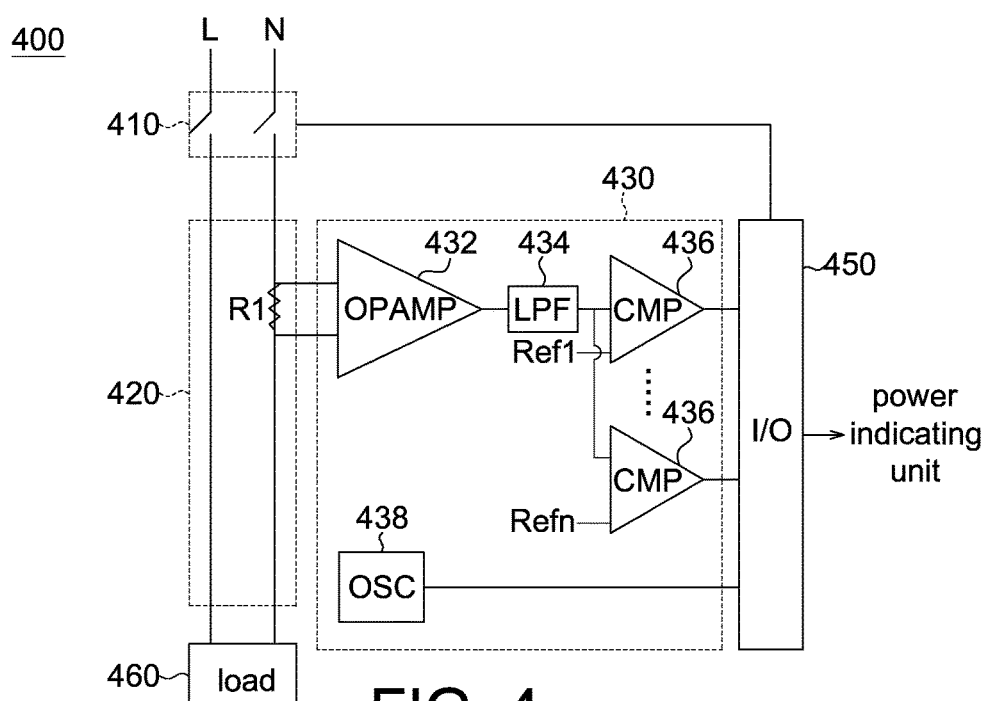
FIG. 4 is a circuit diagram of an electrical energy transferring device 400 according to an alternate embodiment of the disclosure.

Referring to FIG. 4, a circuit diagram of an electrical energy transferring device 400 according to an alternate embodiment of the disclosure is shown. The circuit configuration of FIG. 4 may be used in the electrical energy transferring device 100 of FIG. 1 and/or the electrical energy transferring device 200 of FIG. 2.

The electrical energy transferring device 400 includes power input sources L and N, a protection unit 410, a sensing unit 420, a signal conversion/processing unit 430, an I/O interface 450 and a load 460. Besides, the electrical energy transferring device 400 further includes a voltage conversion unit (for example, an AC/DC voltage conversion unit) for converting an AC voltage into a DC voltage and supplying the DC voltage to the protection unit 410, the sensing unit 420, the signal conversion/processing unit 430 and the I/O interface 450.

The signal conversion/processing unit 430 includes an operation amplifier (OPAMP) 432, a low-pass filter (LPF) 434, several comparators (CMP) 436 and an oscillation circuit (OSC) 438.

The operation amplifier 432 is coupled to the resistor R1 of the sensing unit 420 for integrating the current signal passing through the resistor R1. The low-pass filter 434 filters the output result of the operation amplifier 432 and outputs to the comparator 436.

The comparator 436 compares a reference value Ref with the output result of the low-pass filter 434 to drive the I/O interface 450. The number of the comparators is determined according to the number of color regions of the electrical energy transferring device 400. The reference values Ref1~Refn (n is the number of the comparators 436) relate to the settings of the upper power limit and the respective color region. Suppose the upper power limit is set as 500 W. If the output result of the low-pass filter 434 indicates that the current power consumption is 300 W, the output signal of the corresponding comparator CMP 436 will drive the power indicating unit to show yellow color. The power indicating unit whose display region is lower than the reference value does not show the power consumption.

The oscillation circuit 438 provides a clock signal required by the I/O interface 450 in flashing.

The circuit configuration of FIG. 4 may be used in the electrical energy transferring device 100 of FIG. 1 and/or the electrical energy transferring device 200 of FIG. 2 which shows the power consumption information by using single-color display regions.

Figure 5:
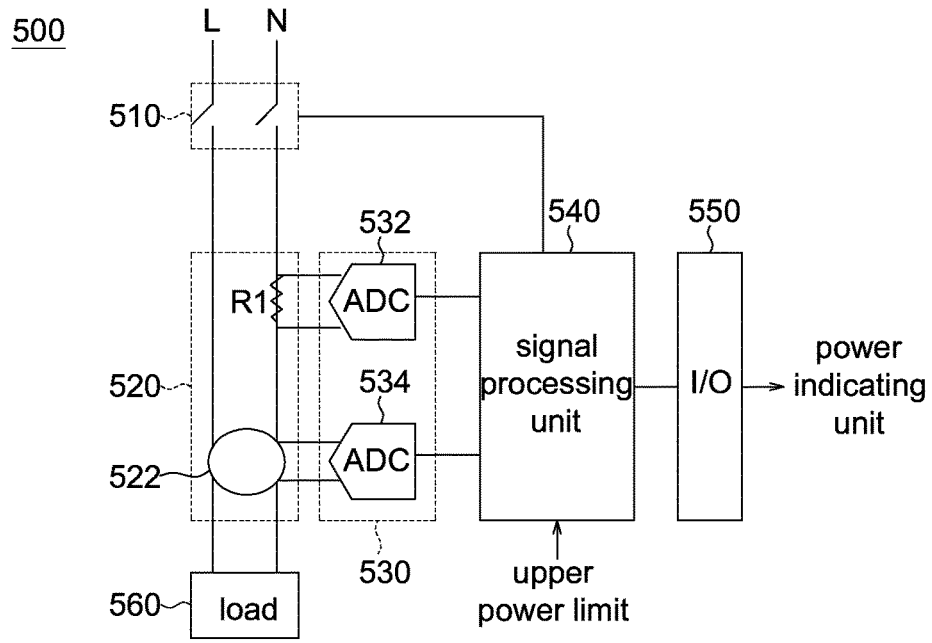
FIG. 5 is a circuit diagram of an electrical energy transferring device according to another embodiment of the disclosure.

Referring to FIG. 5, a circuit diagram of an electrical energy transferring device 500 according to another embodiment of the disclosure is shown. The circuit configuration of FIG. 5 may be used in the electrical energy transferring device 100 of FIG. 1 and/or the electrical energy transferring device 200 of FIG. 2. The electrical energy transferring device 500 includes power input sources L and N, a protection unit 510, a sensing unit 520 (having a resistor R1 and a leakage current sensor 522), a conversion unit 530 (having ADC 532 and 534), a signal processing unit 540, an I/O interface 550 and a load 560.

The circuit configuration of FIG. 5 is similar to that of FIG. 3 except that the circuit configuration of FIG. 3 measures voltage while the circuit configuration of FIG. 5 measures leakage current. When the user presses the leakage current testing press-key on the electrical energy transferring device, the leakage current sensor 522 of FIG. 5 may sense a leakage current. The sensing result of the leakage current sensor 522 may be outputted to the ADC 534 and the signal processing unit 540. The signal processing unit 540 determines whether the leakage current exists and shows the testing result.

Operation details of FIG. 5 are similar to that of FIG. 3, and are not repeated here.

The circuit configuration of FIG. 5 may be used in the electrical energy transferring device 100 of FIG. 1 and/or the electrical energy transferring device 200 of FIG. 2 which shows the power consumption information by using a full-color blend display.

Although FIG. 3 and FIG. 5 are two different embodiments, the two embodiments may be combined in practical application. That is, through the encoding on the result from the signal processing unit 340/540, the signal processing unit 340/540 may be used in detecting power consumption or leakage current.

Figure 6:
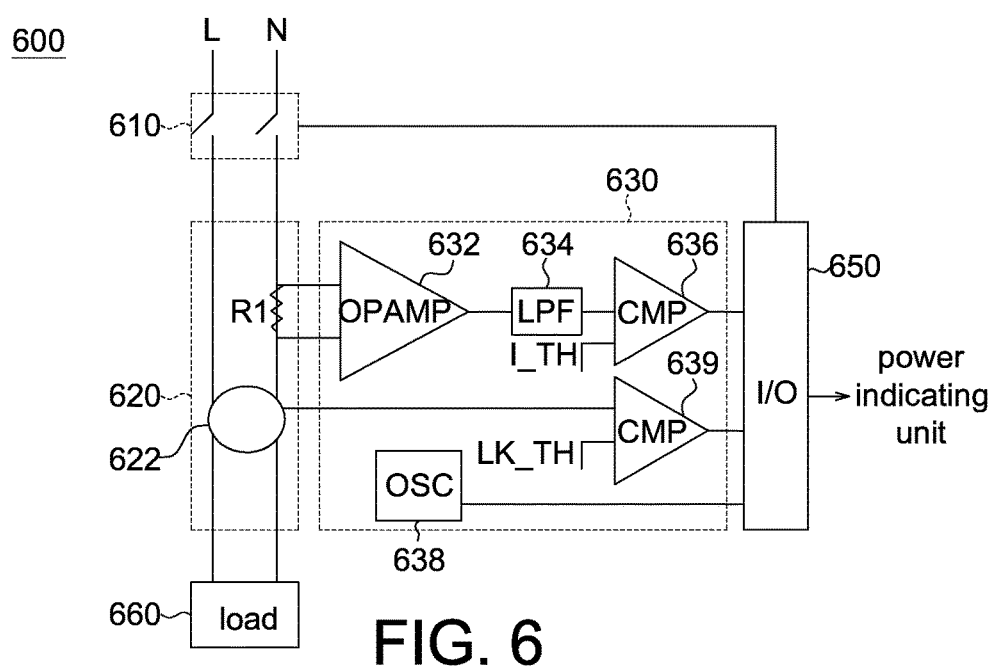
FIG. 6 is a circuit diagram of an electrical energy transferring device according to an alternate embodiment of the disclosure.

Referring to FIG. 6, a circuit diagram of an electrical energy transferring device 600 according to an alternate embodiment of the disclosure is shown. The circuit configuration of FIG. 6 may be used in the electrical energy transferring device 100 of FIG. 1 and/or the electrical energy transferring device 200 of FIG. 2.

The electrical energy transferring device 600 includes power input sources L and N, a protection unit 610, a sensing unit 620 (including a resistor R1 and a leakage current sensor 622), a signal conversion/processing unit 630 (including an operation amplifier (OPAMP) 632, a low-pass filter (LPF) 634, comparators (CMP) 636 and 639, and an oscillation circuit (OSC) 638), an I/O interface 650 and a load 660.

Likewise, the comparator 636 compares a current signal with a current threshold I_TH to decide the region of the current power consumption and drive the I/O interface 650 and the power indicating unit.

The comparator 639 compares a leakage current signal with a leakage current threshold LK_TH to decide the current status of the leakage current and drive the I/O interface 650 and the power indicating unit.

The circuit configuration of FIG. 6 may be used in the electrical energy transferring device 100 of FIG. 1 and/or the electrical energy transferring device 200 of FIG. 2 which shows the power consumption information by using single-color display regions.

Figure 7:
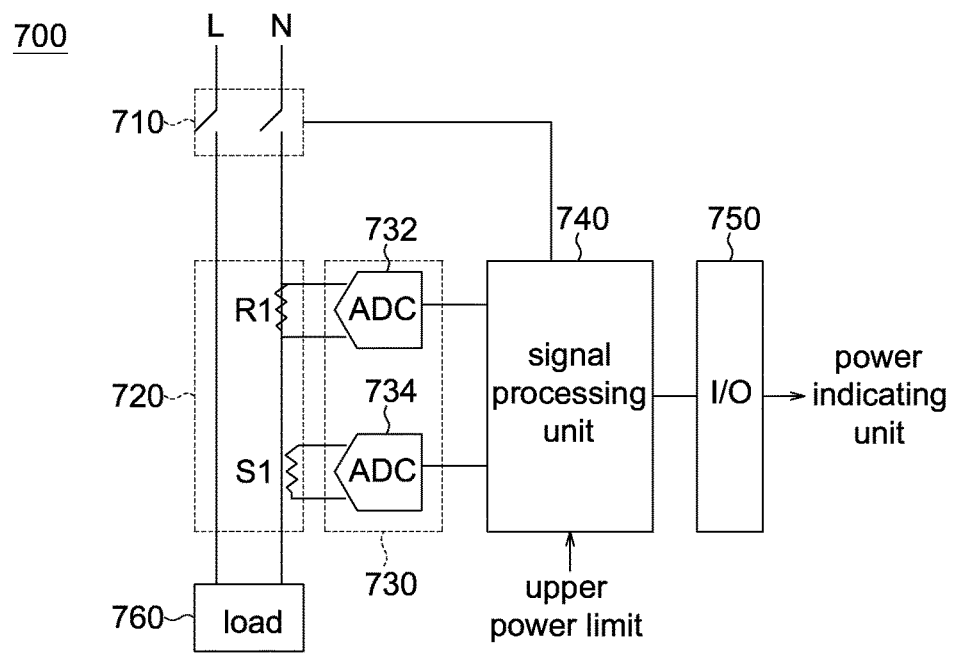
FIG. 7 is a circuit diagram of an electrical energy transferring device according to another embodiment of the disclosure.

Referring to FIG. 7, a circuit diagram of an electrical energy transferring device 700 according to another embodiment of the disclosure is shown. The circuit configuration of FIG. 7 may be used in the electrical energy transferring device 100 of FIG. 1 and/or the electrical energy transferring device 200 of FIG. 2. The electrical energy transferring device 700 includes power input sources L and N, a protection unit 710, a sensing unit 720 (including a resistor R1 and a temperature sensor S1), a conversion unit 730 (including ADCs 732 and 734), a signal processing unit 740, an I/O interface 750 and a load 760.

The circuit configuration of FIG. 7 is similar to that of FIG. 3 and FIG. 5 except that the electrical energy transferring device of FIG. 7 may measure the temperature inside the electrical energy transferring device. The sensing result of the temperature sensor S1 may be sent to the ADC 734 and the signal processing unit 740. The signal processing unit 740 determines whether the temperature inside the electrical energy transferring device is over a threshold.

Operation details of FIG. 7 are similar to that of FIG. 3 and FIG. 5, and are not repeated here.

The circuit configuration of FIG. 7 may be used in the electrical energy transferring device 100 of FIG. 1 and/or the electrical energy transferring device 200 of FIG. 2 which shows the power consumption information by using a full-color blend display.

Figure 8:
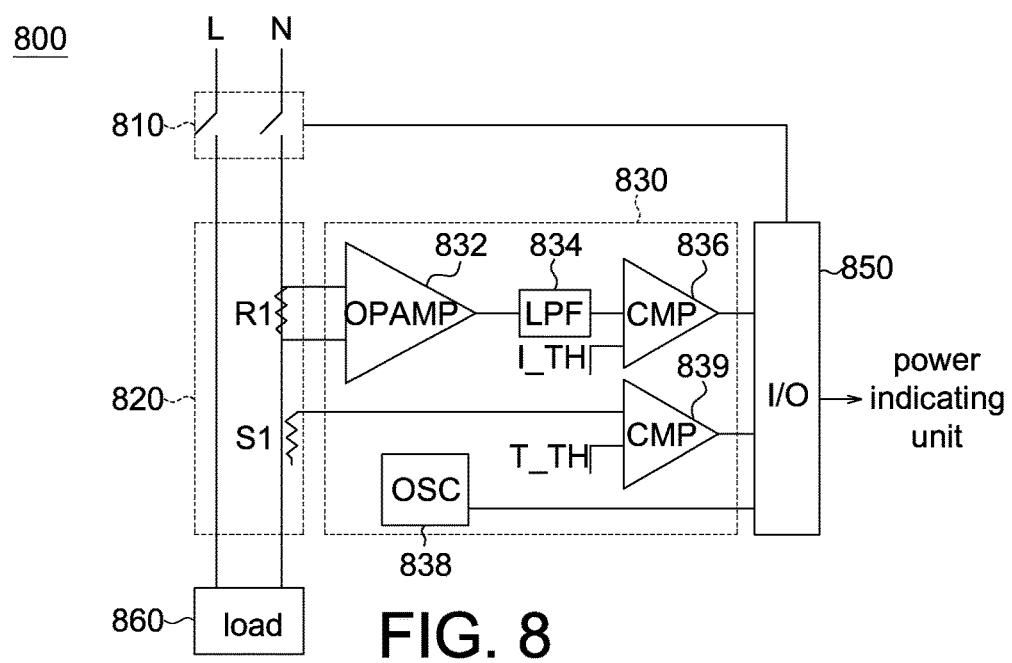
FIG. 8 is a circuit schematic diagram of an electrical energy transferring device according to an alternate embodiment of the disclosure.

Referring to FIG. 8, a circuit diagram of an electrical energy transferring device 800 according to an alternate embodiment of the disclosure is shown. The circuit configuration of FIG. 8 may be used in the electrical energy transferring device 100 of FIG. 1 and/or the electrical energy transferring device 200 of FIG. 2.

The electrical energy transferring device 800 includes power input sources L and N, a protection unit 810, a sensing unit 820 (including a resistor R1 and a temperature sensor S1), a signal conversion/processing unit 830 (including an operation amplifier 832, a low-pass filter 834, comparators 836 and 839, and an oscillation circuit 838), an I/O interface 850 and a load 860.

Likewise, the comparator 839 compares the temperature signal sensed by the temperature sensor S1 with a temperature threshold T_TH to decide the current temperature.

The circuit configuration of FIG. 8 may be used in the electrical energy transferring device 100 of FIG. 1 and/or the electrical energy transferring device 200 of FIG. 2 which shows the power consumption information by using single-color display regions.

Figure 9:
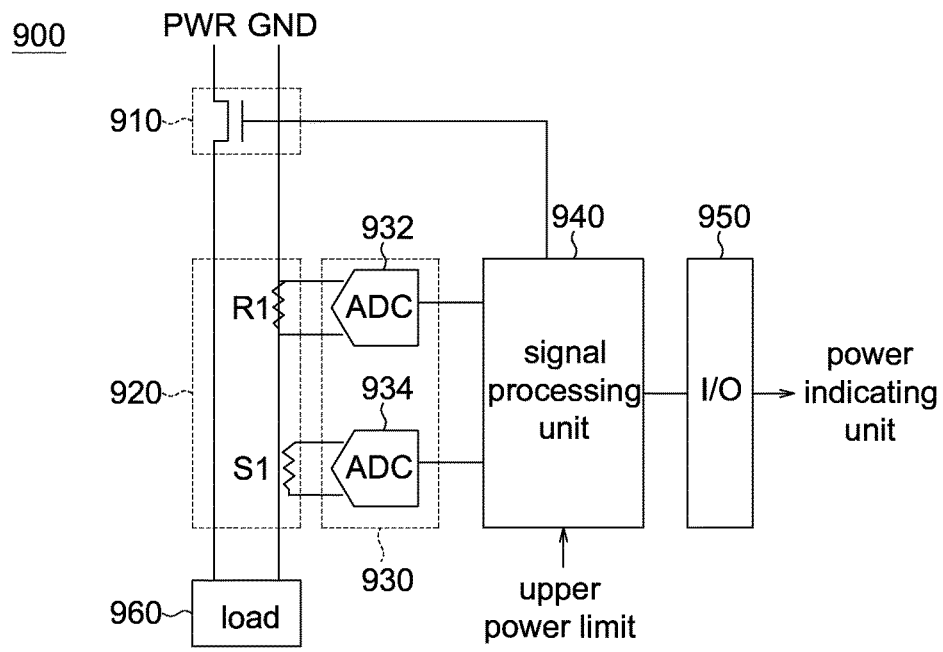
FIG. 9 is a circuit schematic diagram of an electrical energy transferring device according to another embodiment of the disclosure.

Referring to FIG. 9, a circuit diagram of an electrical energy transferring device 900 according to another embodiment of the disclosure is shown. The circuit configuration of FIG. 9 may be used in the electrical energy transferring device 100 of FIG. 1 and/or the electrical energy transferring device 200 of FIG. 2. The electrical energy transferring device 900 includes power input sources PWR and GND, a protection unit 910, a sensing unit 920 (including a resistor R1 and a temperature sensor S1), a conversion unit 930 (including ADCs 932 and 934), a signal processing unit 940, an I/O interface 950 and a load 960.

The circuit configuration of FIG. 9 is similar to that of FIG. 3, FIG. 5 and FIG. 7 except that the protection unit 910 of FIG. 9 includes an MOS transistor while the protection unit of FIG. 3, FIG. 5 and FIG. 7 includes one or more than one switch relay or mechanical trip switch.

Operation details of FIG. 9 are similar to that of FIG. 3, FIG. 5 and FIG. 7, and are not repeated here.

The circuit configuration of FIG. 9 may be used in the electrical energy transferring device 100 of FIG. 1 and/or the electrical energy transferring device 200 of FIG. 2 which shows the power consumption information by using a full-color blend display.

Figure 10:
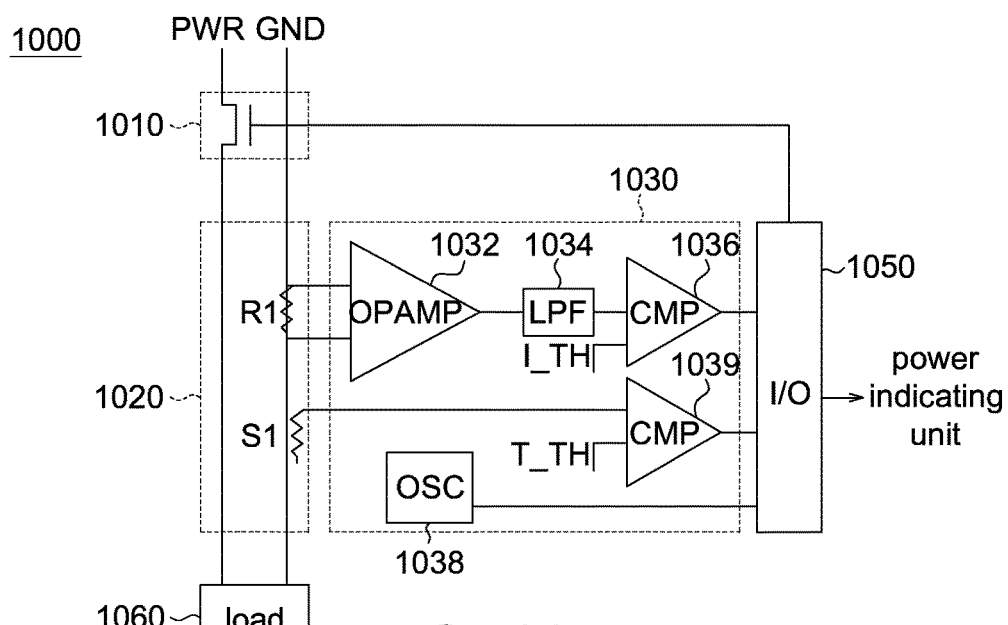
FIG. 10 is a circuit schematic diagram of an electrical energy transferring device according to an alternate embodiment of the disclosure.

Referring to FIG. 10, a circuit diagram of an electrical energy transferring device 1000 according to an alternate embodiment of the disclosure is shown. The circuit configuration of FIG. 10 may be used in the electrical energy transferring device 100 of FIG. 1 and/or the electrical energy transferring device 200 of FIG. 2.

The electrical energy transferring device 1000 includes power input sources PWR and GND, a protection unit 1010, a sensing unit 1020 (including a resistor R1 and a temperature sensor S1), a signal conversion/processing unit 1030 (including an operation amplifier 1032, a low-pass filter 1034, comparators 1036 and 1039, and an oscillation circuit 1038), an I/O interface 1050 and a load 1060.

The circuit configuration of FIG. 10 is similar to that of FIG. 4, FIG. 6 and FIG. 8 except that the protection unit 1010 of FIG. 10 includes an MOS transistor while the protection unit of FIG. 4, FIG. 6 and FIG. 8 includes one or more than one switch relay or mechanical trip switch.

Operation details of FIG. 10 are similar to that of FIG. 4, FIG. 6 and FIG. 8, and are not repeated here.

The circuit configuration of FIG. 10 may be used in the electrical energy transferring device 100 of FIG. 1 and/or the electrical energy transferring device 200 of FIG. 2 which shows the power consumption information by using single-color display regions.

Furthermore, the protection unit of FIG. 9 and FIG. 10 may also be used in the above drawings of the disclosure and are still within the spirit of the disclosure.

For convenience of reference, in the embodiments of the disclosure, the sensing unit, the conversion unit, the signal processing unit, the signal conversion/processing unit of FIGS. 3-10 are collectively referred as "electrical source measuring unit".

Figure 11:
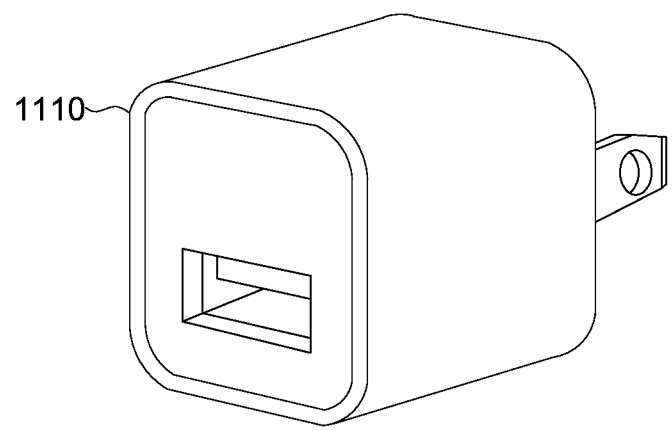
FIG. 11 is a schematic diagram of an electrical energy transferring device (charger) according to an embodiment of the disclosure.

Referring to FIG. 11, an electrical energy transferring device 1100 according to an embodiment of the disclosure is shown. In the present embodiment, the electrical energy transferring device 1100 is exemplified by a charger. Exemplarily but not restrictively, the electrical energy transferring device 1100 may include the sensing unit, the signal processing unit, and/or the signal conversion/processing unit 430 of FIGS. 3-10.

When the electrical energy transferring device 1100 is connected to an electrical energy receiving device (a mobile device such as a mobile phone or a tablet computer), the electrical energy transferring device 1100 may detect the charging current and estimate the charge volume according to the detected charging current. Then, the charging indicating unit 1110 of the electrical energy transferring device 1100 (including one full-color LED or several single-color LEDs) may show the charging status of the mobile phone by using different light colors. For example, if the charging status of the mobile phone is lower is below 60%, the light color is red. If the charging status of the mobile phone may reach 60%, the light color is orange. If the charging status of the mobile phone may reach 70%, the light color is yellow. If the charging status of the mobile phone may reach 80%, the light color is green. If the charging status of the mobile phone may reach 100%, the light color is blue. Thus, the user may conveniently understand current charging status by checking the light color shown by the charging indicating unit 1110.

In addition, the present embodiment may avoid overcharging. For example, if the light color shows blue and lasts for more than 1 hour, the internal switch (such as the MOS transistor of the protection units 910 and 1010) of the electrical energy transferring device 1100 may cut the power off to avoid the mobile phone being overcharged.

Figure 12:
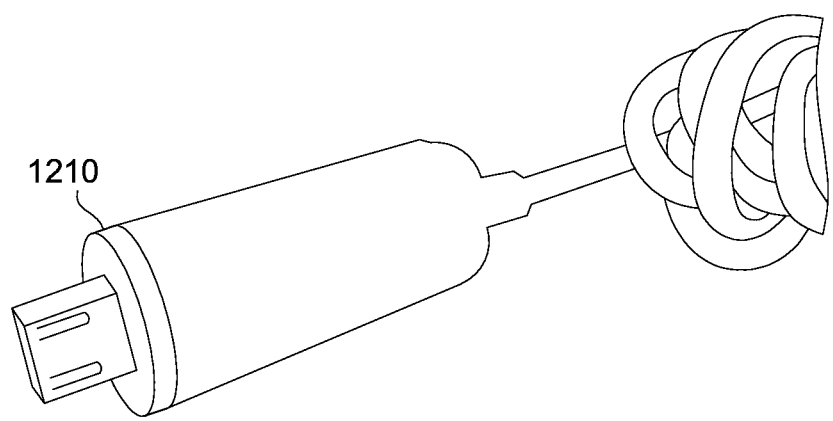
FIG. 12 is a schematic diagram of an electrical energy transferring device (transmission line) according to an embodiment of the disclosure.

FIG. 12 is an electrical energy transferring device 1200 according to an embodiment of the disclosure. In the present embodiment, the electrical energy transferring device 1200 is exemplified by a transmission line. Exemplarily but not restrictively, the electrical energy transferring device 1200 includes the sensing unit, the signal processing unit, and/or the signal conversion/processing unit of FIGS. 3-10.

Likewise, when the electrical energy transferring device 1200 is connected to the electrical energy receiving device (a mobile device such as a mobile phone or a tablet computer), the electrical energy transferring device 1200 may detect the charging current and estimate the charge status according to the detected charging current. Then, the charging indicating unit 1210 of the electrical energy transferring device 1200 (including one full-color LED or several single-color LEDs) may show the charging status of the mobile phone by showing different light colors.

Also, the present embodiment may avoid overcharging. For example, if the light color shows blue and lasts for more than 1 hour, the internal switch (such as the MOS transistor of the protection units 910 and 1010) of the electrical energy transferring device 1100 may cut the power off to avoid the mobile phone being overcharged.

In the above embodiments of the disclosure, the power consumption of a socket or an extension cord may be measured by power measuring technology, and the user may conveniently recognize current power consumption according to a visual signal or an audio signal. Furthermore, in an embodiment of the disclosure, the power consumption status may be shown by way of light, flash and sound to remind the user whether the current load is outside a power consumption range. Therefore, power consumption will not be overloaded, and power interruption and electrical fire may be avoided.

In the above embodiments of the disclosure, the charging current of a charger or a transmission line may be measured by power measuring technology, and the user may easily recognize the current charging status according to a visual signal or an audio signal.

While the disclosure has been described by way of example and in terms of the embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical energy transferring device coupled to an electrical energy receiving device, comprising:
   at least one socket;
   an electrical source measuring unit for detecting power consumption of the electrical energy receiving device; and
   a power consumption indicating unit coupled to the electrical source measuring unit for showing the power consumption of the electrical energy receiving device by a color signal,
   the power consumption indicating unit surrounding the at least one socket,
   wherein the power consumption indicating unit includes a plurality of single-color display elements for showing the power consumption of the electrical energy receiving device by respective single-color display regions,
   each of the single-color display regions has a display buffer hysteresis region, and
   when the display buffer hysteresis region is reached, the single-color display region is switched.

2. The electrical energy transferring device according to claim 1, further comprising:

an upper power limit selection unit for setting an upper power limit of the electrical energy transferring device; and/or a protection unit for breaking off a power input path of the electrical energy transferring device if the electrical energy transferring device detects that the power consumption of the electrical energy receiving device is over a threshold.

3. The electrical energy transferring device according to claim 1, wherein the electrical energy transferring device comprises a power extension cord, or a charger or a transmission line.

4. The electrical energy transferring device according to claim 3, wherein, the electrical energy transferring device comprises a plurality of sockets, the power consumption indicating unit indicates the sum of power consumptions of all the sockets.

5. The electrical energy transferring device according to claim 3, wherein, the electrical energy transferring device comprises a plurality of sockets, and the power consumption indicating unit indicates the power consumption of the respective socket.

6. The electrical energy transferring device according to claim 1, wherein the electrical source measuring unit comprises:

a sensing unit for sensing a current or a voltage or a temperature or a leakage current;

a conversion unit coupled to the sensing unit for converting the current and/or the voltage and/or temperature and/or the leakage current; and a signal processing unit coupled to the conversion unit for deciding the power consumption of the electrical energy receiving device, and/or whether the temperature is too high, and/or whether the leakage current exists according to an output from the conversion unit.

7. The electrical energy transferring device according to claim 1, wherein the electrical source measuring unit comprises:

a sensing unit for sensing a current or a voltage or a temperature or a leakage current;

a conversion unit coupled to the sensing unit for converting the current and/or the voltage and/or temperature and/or the leakage current;

a signal conversion/processing unit coupled to the conversion unit for integrating, filtering and comparing an output of the conversion unit with a reference value to decide the power consumption of the electrical energy receiving device, and/or whether the temperature is too high, and/or whether the leakage current exists.

* * * * *